US012692088B2

(12) United States Patent (10) Patent No.: US 12,692,088 B2
Ueda et al. (45) Date of Patent: Jul. 28, 2026

(54) ARTICLE TRANSPORT FACILITY

(71) Applicant: Daifuku Co., Ltd., Osaka (JP)

(72) Inventors: Toshihito Ueda, Hinocho (JP); Akira Suzuki, Hinocho (JP); Tomoaki Nishikawa, Hinocho (JP); Ayaka Kawanami, Hinocho (JP); Shota Inden, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 511 days.

(21) Appl. No.: 18/210,258

(22) Filed: Jun. 15, 2023

(65) Prior Publication Data

US 2023/0406644 A1 Dec. 21, 2023

(30) Foreign Application Priority Data

Jun. 17, 2022 (JP) ................................. 2022-098275

(51) Int. Cl.
| | |
|---|---|
| *B65G 43/00* | (2006.01) |
| *B65G 35/00* | (2006.01) |
| *G05D 1/698* | (2024.01) |
| *G05D 107/70* | (2024.01) |
| *G06F 8/65* | (2018.01) |
| *H10P 72/00* | (2026.01) |
| *H10P 72/30* | (2026.01) |
| *G05D 1/644* | (2024.01) |

(52) U.S. Cl.
CPC ............. *B65G 43/00* (2013.01); *B65G 35/00* (2013.01); *G05D 1/6987* (2024.01); *G06F 8/65* (2013.01); *B65G 2203/0266* (2013.01); *G05D 2107/70* (2024.01); *H10P 72/0612* (2026.01); *H10P 72/3216* (2026.01)

(58) Field of Classification Search
CPC ............................... B65G 43/00; B65G 35/00; B65G 2203/0266; B65G 49/061; G06F 8/65; H01L 21/67276; H01L 21/67727; H01L 21/67733
See application file for complete search history.

(56) References Cited

U.S. PATENT DOCUMENTS

| | | | | |
|---|---|---|---|---|
| 6,735,766 B1 * | 5/2004 | Chamberlain | ............ | G06F 8/65 |
| | | | | 709/219 |
| 2017/0082989 A1 * | 3/2017 | Kumagai | ............... | B65G 43/00 |
| 2019/0108010 A1 * | 4/2019 | Tillman | ................. | H04L 67/12 |

FOREIGN PATENT DOCUMENTS

| | | | | | |
|---|---|---|---|---|---|
| CN | 109408090 A | * | 3/2019 | .............. | G06F 8/65 |
| JP | 2006313462 A | * | 11/2006 | | |

OTHER PUBLICATIONS

CN-109408090-A (Year: 2019).*
JP-2006313462-A (Year: 2006).*

* cited by examiner

*Primary Examiner* — Ernesto A Suarez
*Assistant Examiner* — Laurence R Brothers
(74) *Attorney, Agent, or Firm* — The Webb Law Firm

(57) ABSTRACT

An update processing section distributes update data for section control software to a target section control device targeted for update from among a plurality of section control devices. Upon receipt of the update data, the target section control device executes software update to update the section control software by use of the update data. During the execution of the software update by the target section control device, the superior control device executes alternative control to control a carrier traveling in a specific section corresponding to the target section control device, instead of the target section control device.

7 Claims, 4 Drawing Sheets

ARTICLE TRANSPORT FACILITY

CROSS-REFERENCE TO RELATED APPLICATION

This application claims priority to Japanese Patent Application No. 2022-098275 filed Jun. 17, 2022, the disclosure of which is hereby incorporated by reference in its entirety.

BACKGROUND OF THE INVENTION

1. Field of the Invention

The present invention relates to an article transport facility including a carrier configured to transport an article, section control devices each provided for a corresponding specific section from among a plurality of specific sections and configured to control the carrier traveling in the corresponding specific section, and a superior control device configured to control the carrier and the plurality of section control devices.

2. Description of the Related Art

For example, Japanese Unexamined Patent Application Publication No. 2006-313462 (Patent Document 1) discloses a technology to update map data on a transport path in a transport wagon system. Hereinafter, reference signs described within parentheses in the Description of the Related Art are reference signs used in Patent Document 1.

The transport wagon system disclosed in Patent Document 1 includes: a plurality of wagons (1) configured to transport a processing object; a transport path (2) on which the wagons (1) move; a plurality of zone controllers (3) each configured to control a wagon (1) in a predetermined area on the transport path (2); and an integrated computer (7) configured to control all the zone controllers (3). The integrated computer (7) transmits map data for update to an applicable zone controller (3) among the zone controllers (3). The zone controller (3) transmits the map data for update, received from the integrated computer (7), to a wagon (1) in a predetermined areas managed by the zone controller (3).

The transport wagon system disclosed in Patent Document 1 stops the wagon (1) the map data of which is to be updated at a place where the wagon (1) does not disturb traveling of the other wagons (1), so that the wagons (1) the map data of which is not updated continue normal transport operation. Hereby, in this system, the map data of each wagon (1) is updated to new map data without stopping the transport operation of articles as the whole system.

SUMMARY OF THE INVENTION

In the meantime, in the technical field as described above, a branching part where a path branches off, a merging part where paths merge together, or the like may be provided on a travel path for carriers. A specific section provided with such a branching part or a merging part may be provided with a section control device. The section control device is configured to control a carrier traveling in the specific section, so that a plurality of carriers can travel in the specific section smoothly without interfering with each other. The control by the section control device is often performed in accordance with software installed in advance, but in a case of correcting or updating the software, it can be necessary to update the software in the section control device. However, during the update of the software, generally, the carrier cannot be controlled by the section control device. Accordingly, during the update of the software in the section control device, the efficiency of transportation of articles may be decreased due to such a necessity that the carrier should be stopped or detour around the specific section.

In view of such actual circumstances, it is desired to achieve a technology that can execute update of software in a section control device while the decrease in the efficiency of transportation of articles is prevented.

A technology to achieve the above object is as follows.

An article transport facility includes a carrier configured to transport an article, a travel path provided as a path on which the carrier travels and including a plurality of specific sections including at least one of a branching part and a merging part of the path, section control devices each provided for a corresponding specific section from among the plurality of specific sections and configured to control the carrier traveling in the corresponding specific section, and a superior control device configured to control the carrier and the plurality of section control devices. Each of plurality of the section control devices is configured to operate in accordance with section control software installed in the each of the plurality of the section control devices. The article transport facility includes an update processing section configured to execute an update process procedure of updating the section control software. The update processing section distributes update data for the section control software to a target section control device targeted for update from among the plurality of section control devices. Upon receipt of the update data, the target section control device executes software update to update the section control software by use of the update data. During the execution of the software update, the superior control device executes alternative control to control the carrier traveling in a specific section corresponding to the target section control device, instead of the target section control device.

With this configuration, during the update of the section control software by the target section control device, the superior control device controls the carrier traveling in the specific section instead of the target section control device. Accordingly, it is possible to appropriately control the carrier in the specific section while the software update is executed by the section control device. Further, since the carrier can continue to travel in the specific section even during the execution of the software update by the section control device, it is possible to prevent the efficiency of transportation of articles from decreasing as the whole facility.

Further features and advantages of the technology according to this disclosure will become clearer by the following illustrative and nonlimiting description of embodiments to described with reference to the drawings.

DESCRIPTION OF THE INVENTION

An embodiment of an article transport facility will be described below with reference to drawings.

Figure 1:
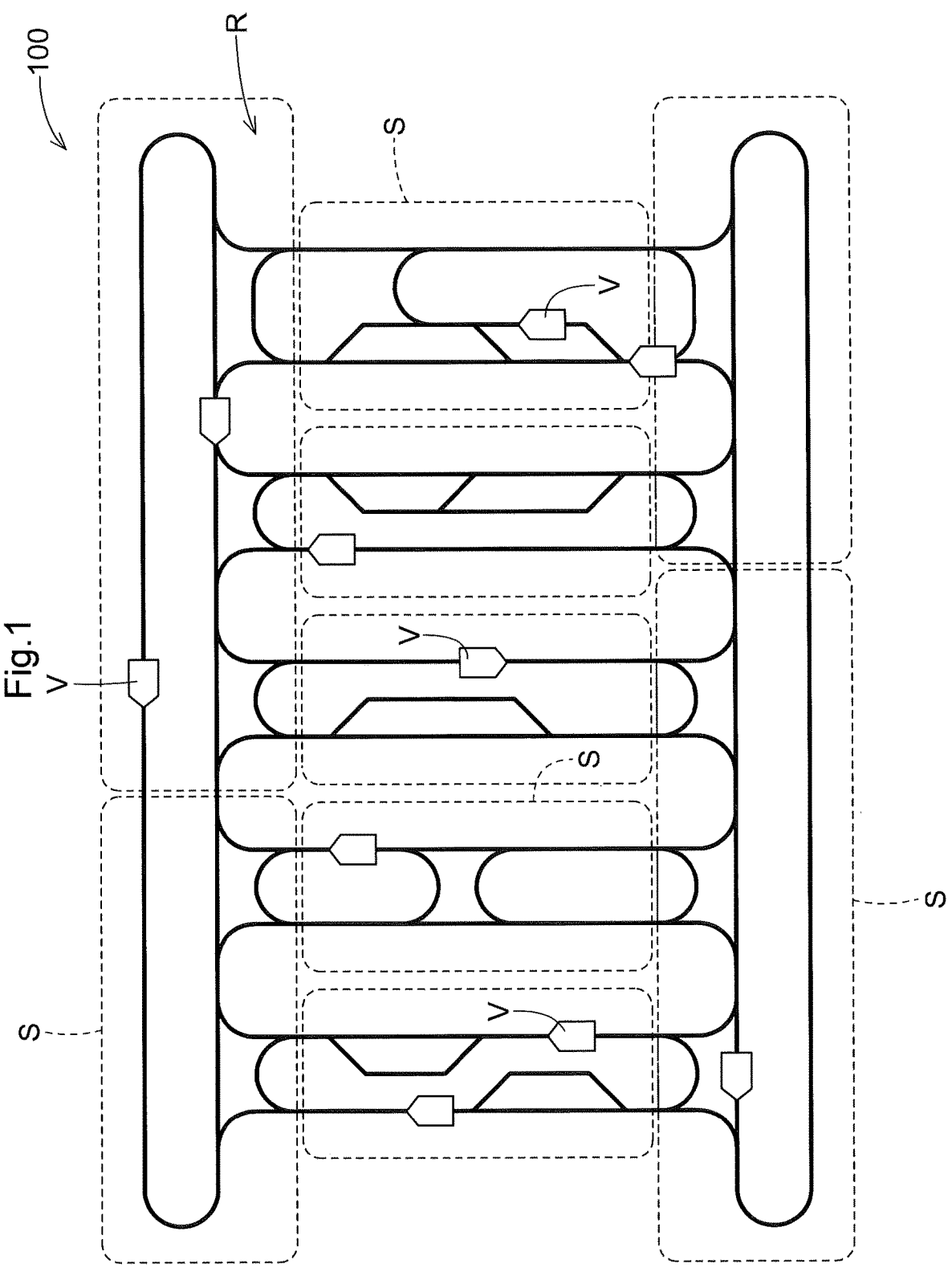
FIG. 1 is a plan view of an article transport facility.
Figure 2:
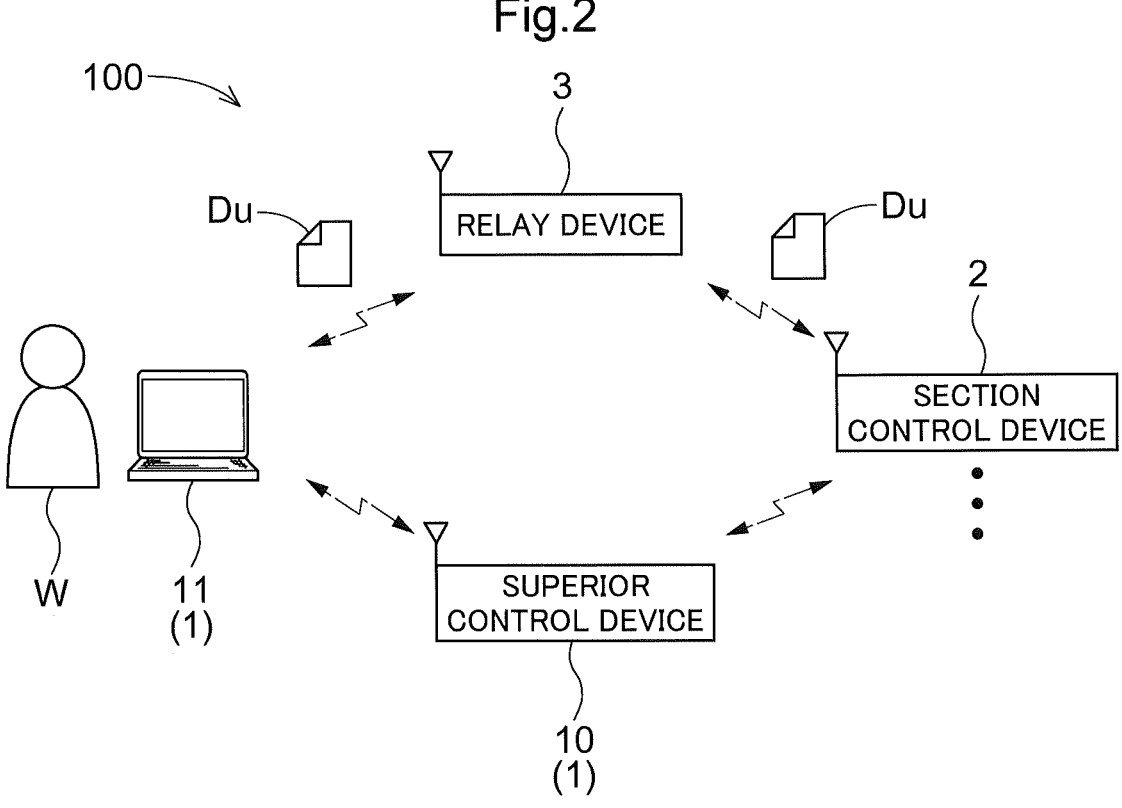
FIG. 2 is a control block view.

As illustrated in FIGS. 1, 2, an article transport facility 100 includes a carrier V configured to transport an article, a travel path R provided as a path on which the carrier V travels and including a plurality of specific sections S including at least one of a branching part and a merging part of the path, section control devices 2 each provided for a corresponding specific section S from among the plurality of specific sections S and configured to control the carrier V traveling in the corresponding specific section S, and a superior control device 10 configured to control the carrier V and the plurality of section control devices 2.

The article transport facility 100 includes a plurality of carriers V. Each of the carriers V is configured to travel along the travel path R and transports an article to each place. The carrier V can be an unmanned carrier traveling along a floor face, a ceiling carrier traveling in the vicinity of a ceiling, or the like.

Various articles are handled as articles to be transported in the article transport facility 100. For example, in a case where the article transport facility 100 is used in a semiconductor production factory, the articles are a wafer storage container (so-called FOUP: Front Opening Unified Pod) storing wafers, a reticle storage container (so-called reticle pod) storing reticles, and so on. In this case, the carrier V transports an article such as a wafer storage container or a reticle storage container along the travel path R between steps.

The travel path R includes a straight path and a curved path and also includes a crossing part where a plurality of paths intersects with each other. The crossing part includes a branching part where one path branches into a plurality of paths and a merging part where a plurality of paths merges together. As described above, the specific section S includes at least one of the branching part and the merging part. The specific section S includes one or more branching parts, one or more merging parts, or a combination thereof. In the example illustrated in FIG. 1, the specific section S is set as a range including a plurality of branching parts and a plurality of merging parts on the travel path R. The range of the specific section S can be determined to a given range.

The superior control device 10 is configured to control the plurality of carriers V and the plurality of section control devices 2. For example, the superior control device 10 is configured to perform, on each carrier V, a transport command with a specified transport source and a specified transport destination of an article. The superior control device 10 is configured to be communicable with each carrier V and is able to grasp a current position of each carrier V. Further, the superior control device 10 is configured to be communicable with each section control device 2 and is able to grasp a state of each specific section S upon receipt of a situation report (a report of a traffic condition or the like) about each specific section S from each section control device 2.

Figure 3:
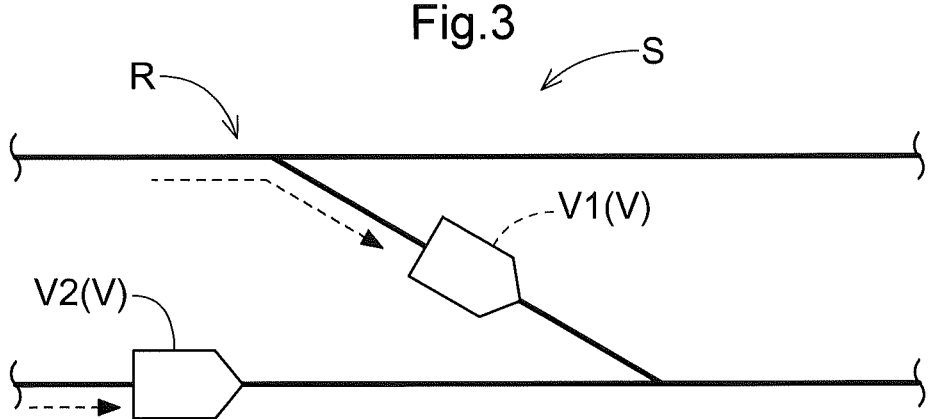
FIG. 3 is a view illustrating control on a carrier traveling in a specific section.

The section control device 2 is configured to control the carrier V traveling in a specific section S managed by the section control device 2. More specifically, the section control device 2 causes a plurality of carriers V to travel in the specific section S managed by the section control device 2 such that the plurality of carriers V does not interfere with each other. For example, FIG. 3 illustrates a state where two carriers V (one of them is referred to as a carrier V1, and the other one is referred to as a second carrier V2) travel in a specific section S including a branching part and a merging part. In a case where the first carrier V1 and the second carrier V2 are to pass the same merging part, the section control device 2 causes them to pass at different timings. In the example illustrated in FIG. 3, the section control device 2 controls the first carrier V1 and the second carrier V2 such that the first carrier V1 passes the merging part first, and the second carrier V2 is decelerated or stopped and then passes the merging part after the first carrier V1.

The section control device 2 is configured to operate in accordance with section control software installed in the section control device 2. Hereby, the section control device 2 implements control on the carrier V in the specific section S managed by the section control device 2.

The superior control device 10 and the section control device 2 each include a processor such as a microcomputer, a peripheral circuit such as a memory, and so on, for example. When such hardware collaborates with a program executed on a processor of a computer or the like, each process or each function is implemented.

As illustrated in FIG. 2, the article transport facility 100 includes an update processing section 1 configured to execute an update process procedure of the section control software. In the present embodiment, the update processing section 1 includes the superior control device 10 and an update control terminal 11 communicably connected to the superior control device 10. The update processing section 1 may be configured to include hardware and software other than the superior control device 10 and the update control terminal 11. In the present embodiment, the article transport facility 100 further includes a relay device 3 (e.g., a file transfer server) configured to relay transmission and reception of data between the update processing section 1 and the section control device 2.

The update control terminal 11 includes an operating section to be operated by an operator W and a display section configured to display various pieces of information. For example, information input into the update control terminal 11 by the operator W is transmitted to the superior control device 10. Further, information received from the superior control device 10 is displayed on the display section of the update control terminal 11.

In the present embodiment, the update processing section 1 distributes update data Du for the section control software to a target section control device 2 that is a section control device 2 targeted for update from among the plurality of section control devices 2. In the present embodiment, the update control terminal 11 transmits the update data Du to the relay device 3 by the operation by the operator W. The relay device 3 stores the update data Du received from the update control terminal 11. The section control device 2 acquires the update data Du from the relay device 3 as needed. In the present embodiment, the update control terminal 11 distributes the update data Du to the section control device 2 via the relay device 3 as such. However, the present invention is not limited to such a configuration, and the update control terminal 11 may directly distribute the update data Du to the section control device 2. Alternatively, the update control terminal 11 may indirectly distribute the update data Du to the section control device 2 via the superior control device 10.

The target section control device 2 that has received the update data Du executes software update to update the section control software by use of the update data Du. Hereby, existing section control software used in the section control device 2 before software update is updated. For example, the section control software can be updated in response to a layout change in a facility, a change in facility operation, and the like.

In the present embodiment, the update control terminal 11 performs determination of whether the update process procedure is executed or not, determination of the target section control device 2, and distribution of the update data Du to the target section control device 2. Then, the superior control device 10 performs communication and command (control command or the like) to the target section control device 2.

Thus, the section control software is updated in the section control device 2. However, while the software update is executed, the section control device 2 cannot control the carrier V in the specific section S managed by the section control device 2.

In view of this, in the article transport facility 100 according to this disclosure, during the execution of the software update by the target section control device 2 (the section control device 2), the superior control device 10 executes alternative control to control the carrier V traveling in the specific section S corresponding to the target section control device 2, instead of the target section control device 2. Hereby, it is possible to appropriately control the carrier V in the specific section S while the software update is executed by the section control device 2. Further, since the carrier V can continue to travel in the specific section S even during the execution of the software update by the section control device 2, it is possible to prevent the efficiency of transportation of articles from decreasing as the whole facility.

As illustrated in FIG. 2, in the present embodiment, the update processing section 1 is configured to be able to execute multiple distributions such that the update processing section 1 sets a plurality of section control devices 2 as target section control devices 2 at the same timing and distributes the update data Du to the target section control devices 2. In the present embodiment, the update control terminal 11 is configured to execute multiple distributions via the relay device 3. When the multiple distributions are executed, the plurality of target section control devices 2 (the section control devices 2) executes software update upon receipt of the update data Du, and the superior control device 10 executes alternative control for the plurality of target section control devices 2 executing the software update. Hereby, it is possible to update the section control software of the plurality of section control devices 2 in parallel at the same time. Accordingly, as the whole facility, the section control software can be updated in a relatively short time.

Figure 4:
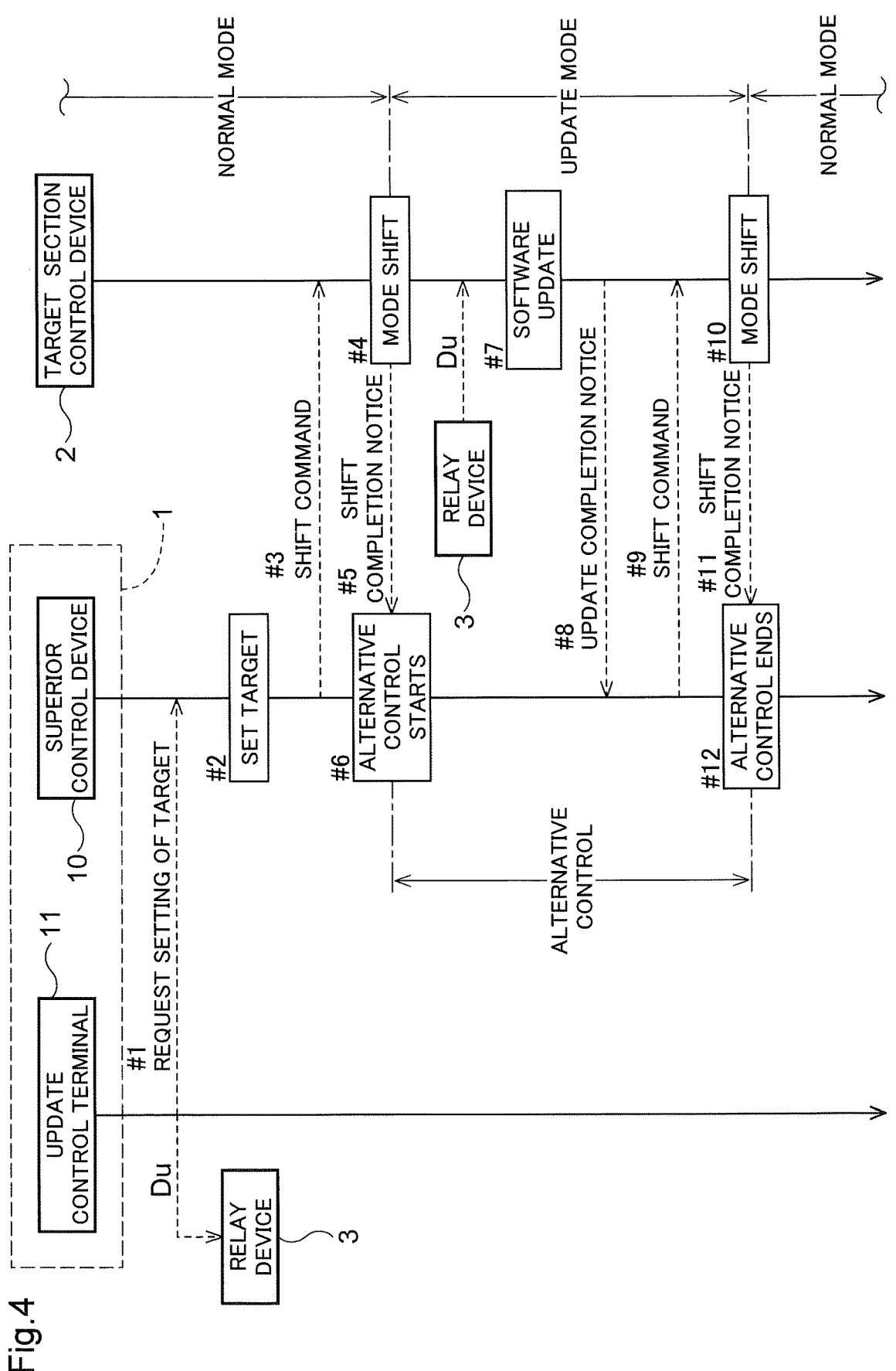
FIG. 4 is a flowchart.

As illustrated in FIG. 4, in the present embodiment, the section control device 2 is configured to be able to shift its mode between a normal mode to perform control on the carrier V and an update mode to perform no control on the carrier V and perform a process of updating software. In a state where the target section control device 2 is in the update mode, the superior control device 10 executes alternative control in the specific section S managed by the target section control device 2. In the present embodiment, the superior control device 10 starts the alternative control at the same time with the target section control device 2 shifting from the normal mode to the update mode and ends the alternative control at the same time with the target section control device 2 shifting from the update mode to the normal mode. In other words, the superior control device 10 executes the alternative control such that the period when the superior control device 10 executes the alternative control is continuous with the period when the section control device 2 is in the normal mode. Hereby, it is possible to avoid a blank period during which the carrier V is not controlled in the specific section S.

With reference to FIG. 4, the following describes the procedure of the control. The vertical axis in FIG. 4 is a time axis.

As illustrated in FIG. 4, the update control terminal 11 requests the superior control device 10 to set a section control device 2 (that is, the target section control device 2) targeted for software update (step #1). At the same time, in the example illustrated herein, the update control terminal 11 transmits, to the relay device 3, the update data Du to be distributed to the target section control device 2. Note that the transmission of the update data Du to the relay device 3 may be performed in advance. For example, the target section control device 2 is determined by the operator W or the like. The update control terminal 11 transmits identification information on the target section control device 2, input by the operator W, to the superior control device 10.

The superior control device 10 sets the section control device 2 requested by the update control terminal 11 as the target section control device 2 (step #2). For example, the superior control device 10 sets the target section control device 2 from among the plurality of section control devices 2, based on the identification information on the section control device 2 that is received from the update control terminal 11.

The superior control device 10 transmits, to the target section control device 2, a shift command to shift from the normal mode to the update mode (step #3). The shift command includes a data acquisition command to acquire the update data Du. As will be described later, in the present embodiment, the section control device 2 acquires the update data Du from the relay device 3.

In a case where the target section control device 2 receives, from the superior control device 10, the shift command to shift from the normal mode to the update mode, the target section control device 2 shifts its mode from the normal mode to the update mode (step #4). Further, the target section control device 2 acquires the update data Du from the relay device 3 in response to the data acquisition command from the superior control device 10. The acquisition of the update data Du is performed before the execution of software update (in the example illustrated herein, after the execution of the mode shift but before the execution of the software update). In the present embodiment, at the same time with the mode shift from the normal mode to the update mode or after the mode is shifted from the normal mode to the update mode, the target section control device 2 transmits a shift completion notice to the superior control device 10 (step #5). The superior control device 10 starts alternative control at the same time as reception of the shift completion notice from the target section control device 2 (step #6). That is, in the present embodiment, the superior control device 10 starts the alternative control on the condition that the target section control device 2 has shifted to the update mode.

In the present embodiment, after the mode is shifted from the normal mode to the update mode, the target section control device 2 executes software update automatically based on the update data Du (step #7).

When the software update is completed in the update mode, the target section control device 2 transmits an update completion notice to the superior control device 10 (step #8). In the present embodiment, after the target section control device 2 transmits the update completion notice to the superior control device 10, the target section control device 2 continues the update mode until the target section control device 2 receives, from the superior control device 10, a shift control to shift from the update mode to the normal mode.

While the target section control device 2 continues the update mode, the superior control device 10 continues the alternative control.

When the superior control device 10 receives the update completion notice from the target section control device 2, the superior control device 10 transmits, to the target section control device 2, a shift command to shift from the update mode to the normal mode (step #9).

When the target section control device 2 receives, from the superior control device 10, the shift command to shift from the update mode to the normal mode, the target section control device 2 shifts its mode from the update mode to the normal mode (step #10). In the present embodiment, at the same time as the mode shift from the update mode to the normal mode or after the mode is shifted from the update mode to the normal mode, the target section control device 2 transmits a shift completion notice to the superior control device 10 (step #11). Then, the superior control device 10 ends the alternative control at the same time as reception of the shift completion notice from the target section control device 2 (step #12). That is, in the present embodiment, the superior control device 10 ends the alternative control on the condition that the target section control device 2 has shifted to the normal mode.

Figure 5:
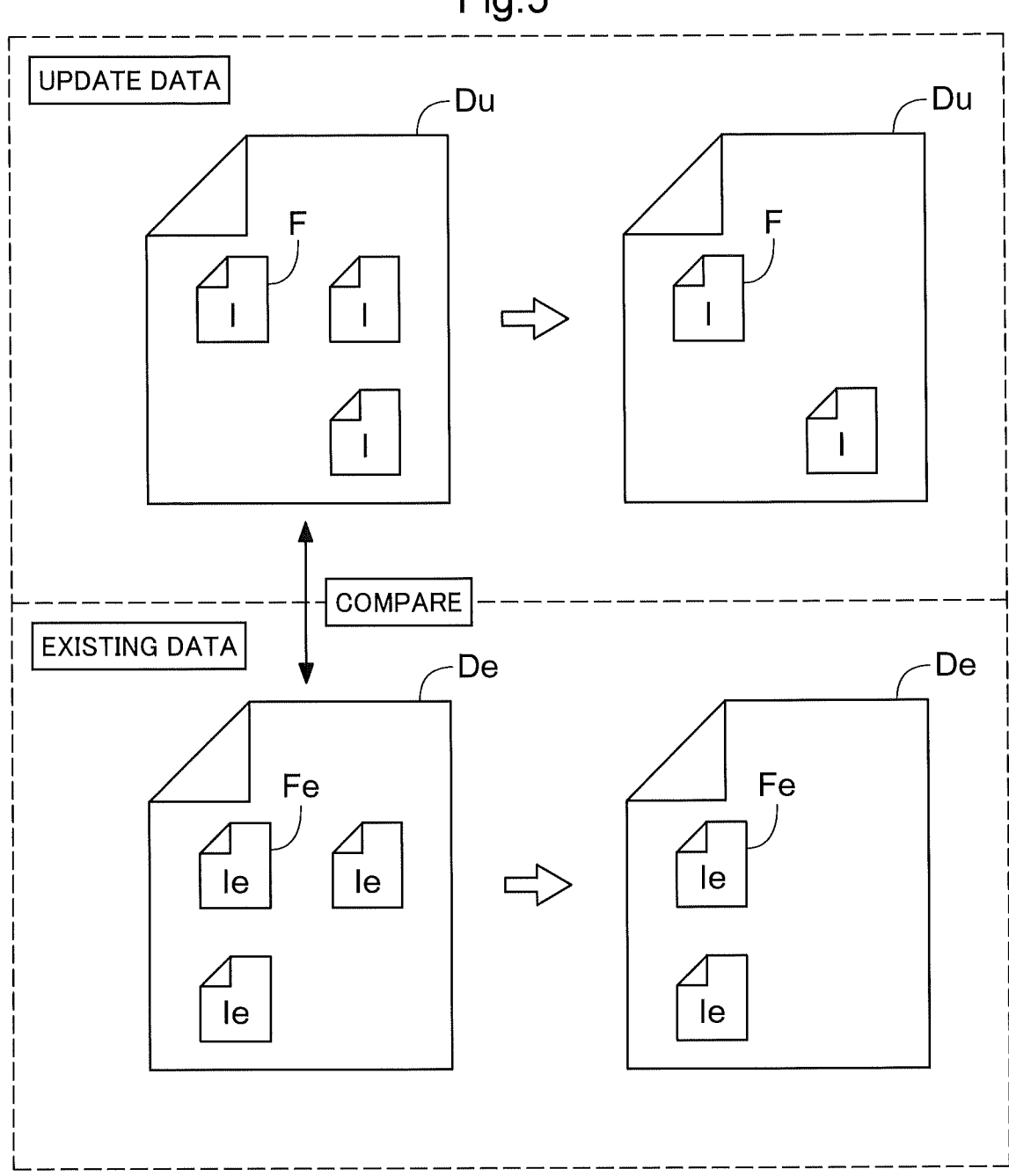
FIG. 5 is an explanatory view about generation of update data and generation of backup data.

Referring now to FIG. 5, the following describes generation of the update data Du. FIG. 5 is an image view of data.

As illustrated in FIG. 5, in the present embodiment, each of a plurality of existing files Fe constituting the section control software includes existing version information Ie.

Further, in the present embodiment, each of a plurality of files F constituting the update data Du includes version information I.

In the present embodiment, the update processing section 1 (see FIG. 2 and so on) compares respective pieces of version information I of the plurality of files F constituting the update data Du with respective pieces of existing version information Ie of the plurality of existing files Fe constituting the section control software (hereinafter referred to as "existing data De") of the target section control device 2 and generates data including files F of the same type but in different versions and files F not existing in the existing files Fe among the plurality of files F constituting the update data Du, as update data Du to be distributed to the target section control device 2 (the update data Du illustrated on the right of a blank arrow in FIG. 5). In other words, only part, of the update data Du, that is different from the existing data De is generated as the update data Du to be distributed to the target section control device 2. Hereby, the data amount of the update data Du to be distributed to the target section control device 2 is easily restrained to be small, so that a communication traffic volume between the update processing section 1 and the section control device 2 (the target section control device 2) can be restrained to be small. Note that, in the present embodiment, the generation of the update data Du to be distributed to the target section control device 2 is performed by the update control terminal 11 but may be performed by the superior control device 10. Alternatively, the generation of the update data Du may be performed in collaboration between the update control terminal 11 and the superior control device 10.

In the present embodiment, the update processing section 1 compares respective pieces of existing version information Ie of the plurality of existing files Fe constituting the section control software (the existing data De) of the target section control device 2 with respective pieces of version information I of the plurality of files F constituting the update data Du and generates, as backup data, data (the existing data De illustrated on the right of a blank arrow in FIG. 5) including existing files Fe of the same type but in different versions and existing files Fe not existing in the files F of the update data Du among the plurality of existing files Fe. In other words, only part, of the existing data De, that is different from the update data Du is generated as backup data. The backup data generated as such is stored in a storage section of the update processing section 1. Hereby, the data amount of the backup data to be receive from the target section control device 2 is easily restrained to be small, and the capacity of the storage section of the update processing section 1 can be restrained to be small. For example, in a case where the target section control device 2 fails in software update, it is possible to perform a process of restoring its original state based on the backup data. Note that all the existing files Fe in the existing data De may be generated as backup data.

With the article transport facility 100 described as above, it is possible to appropriately execute update of software in the section control device 2 while the decrease in the efficiency of transportation of articles is prevented.

Other Embodiments

Next will be described other embodiments of the article transport facility.

(1) The above embodiment has described an example in which the update processing section 1 includes the superior control device 10 and the update control terminal 11 communicably connected to the superior control device 10. However, the present invention is not limited to such an example, and the update processing section 1 may be constituted by only either of the superior control device 10 and the update control terminal 11.

(2) The above embodiment has described an example in which the update control terminal 11 performs the determination of whether the update process procedure is executed or not, the determination of the target section control device 2, and the distribution of the update data Du to the target section control device 2. However, the present invention is not limited to such an example, and the superior control device 10 may perform all or some of the determination of whether the update process procedure is executed or not, the determination of the target section control device 2, and the distribution of the update data Du to the target section control device 2.

(3) The above embodiment has described an example in which, after the mode is shifted from the normal mode to the update mode, the target section control device 2 executes software update automatically based on the update data Du. However, the present invention is not limited to such an example, and after the mode is shifted from the normal mode to the update mode, the target section control device 2 may execute software update in response to an instruction from the superior control device 10 or the update control terminal 11.

(4) The above embodiment has described an example in which only part, of the update data Du, that is different from the existing data De is generated as the update data Du to be distributed to the target section control device 2. However, the present invention is not limited to such an example, and the whole update data Du may be generated as the update data Du to be distributed to the target section control device 2.

(5) The above embodiment has described an example in which only part, of the existing data De, that is different from the update data Du is generated as backup data. However, the present invention is not limited to such an example, and the whole existing data De may be generated as backup data.

(6) Note that the configuration disclosed in the above embodiment can be applied in combination with the configurations disclosed in other embodiments as long as no inconsistency occurs. In terms of other configurations, the embodiment disclosed in the present specification is also just an example in all respects. Accordingly, various modifications can be made appropriately as far as it does not deviate from the scope of this disclosure.

Summary of Embodiment

The following describes the article transport facility described above.

An article transport facility includes a carrier configured to transport an article, a travel path provided as a path on which the carrier travels and including a plurality of specific sections including at least one of a branching part and a merging part of the path, section control devices each provided for a corresponding specific section from among the plurality of specific sections and configured to control the carrier traveling in the corresponding specific section, and a superior control device configured to control the carrier and the plurality of section control devices. Each of the plurality of section control devices is configured to operate in accordance with section control software installed in the each of the plurality of the section control devices. The article transport facility includes an update processing section configured to execute an update process procedure of updating the section control software. The update processing section distributes update data for the section control software to a target section control device targeted for update from among the plurality of section control devices. Upon receipt of the update data, the target section control device executes software update to update the section control software by use of the update data. During the execution of the software update, the superior control device executes alternative control to control the carrier traveling in a specific section corresponding to the target section control device, instead of the target section control device.

In this configuration, during the update of the section control software by the target section control device, the superior control device controls the carrier traveling in the specific section instead of the target section control device. Accordingly, it is possible to appropriately control the carrier in the specific section while the software update is executed by the section control device. Further, since the carrier can continue to travel in the specific section even during the execution of the software update by the section control device, it is possible to prevent the efficiency of transportation of articles from decreasing as the whole facility.

It is preferable that: the update processing section be able to execute multiple distributions such that the update processing section sets a plurality of section control devices as target section control devices at the same time and distributes the update data to each of the target section control devices; when the multiple distributions are executed, the target section control devices each execute software update upon receipt of the update data, and the superior control device execute the alternative control on the target section control devices executing the software update.

With this configuration, it is possible to update the section control software in a plurality of section control devices in parallel at the same time. Accordingly, as the whole facility, the section control software can be updated in a relatively short time.

It is preferable that: the section control devices be each configured to be shiftable between a normal mode to perform control on the carrier and an update mode to perform no control on the carrier and perform a process for the software update; when the software update is completed in the update mode, the target section control device transmit an update completion notice to the superior control device; the superior control device start the alternative control on condition that the target section control device has shifted to the update mode; when the superior control device receives the update completion notice from the target section control device, the superior control device transmits, to the target section control device, a shift command to shift from the update mode to the normal mode and ends the alternative control on condition that the target section control device has shifted to the normal mode.

With this configuration, while the section control device is in the update mode, the alternative control can be performed by the superior control device appropriately. Further, when the section control device is in the normal mode, the alternative control is not performed by the superior control device. Accordingly, it is possible to appropriately avoid the superior control device and the section control device from both performing control on the carrier traveling in the specific section at the same time.

It is preferable that: each of a plurality of existing files constituting the section control software include existing version information; and the update processing section compare version information of each of a plurality of files constituting the update data with the existing version information of a corresponding one of the plurality of existing files constituting the section control software of the target section control device and generate data including files of the same type but in different versions and files not existing in the existing files among the plurality of files constituting the update data, as update data to be distributed to the target section control device.

With this configuration, the data amount of the update data is easily restrained to be small. This accordingly makes it possible to restrain a communication traffic volume between the update processing section and the section control device to be small.

It is preferable that: the update processing section include the superior control device and an update control terminal communicably connected to the superior control device; the update control terminal perform determination of whether the update process procedure is executed or not, determination of the target section control device, and distribution of the update data to the target section control device; and the target section control device perform communication and various commands to the target section control device.

With this configuration, even if the determination on whether or not the update process procedure is executed or not or the determination of the target section control device is performed based on selection by the operator, for example, easiness of the operation by the operator is easily secured. Besides, the superior control device performs the communication with the plurality of section control devices and various commands thereto, so that it is possible to effectively use an existing communications path between the superior control device and each of the section control devices.

INDUSTRIAL APPLICABILITY

The technology according to this disclosure is usable for an article transport facility including: a carrier configured to transport an article; section control devices each provided for a corresponding specific section from among a plurality of specific sections and configured to control the carrier traveling in the corresponding specific section, and a superior control device configured to control the carrier and the plurality of section control devices.

What is claimed is:

1. An article transport facility comprising a carrier configured to transport an article, a travel path provided as a path on which the carrier travels and including a plurality of specific sections including at least one of a branching part and a merging part of the path, section control devices each provided for a corresponding specific section from among the plurality of specific sections and configured to control the carrier traveling in the corresponding specific section, and a superior control device configured to control the carrier and the plurality of section control devices, each of the plurality of section control devices configured to operate in accordance with section control software installed in the each of the plurality of the section control devices, the article transport facility comprising:

an update processing section configured to execute an update process procedure of updating the section control software, wherein:

the update processing section distributes update data for the section control software to a target section control device targeted for update from among the plurality of section control devices;

upon receipt of the update data, the target section control device executes software update to update the section control software by use of the update data; and during the execution of the software update, the superior control device executes alternative control to control the carrier traveling in a specific section corresponding to the target section control device, instead of the target section control device.

2. The article transport facility according to claim 1, wherein:

the update processing section is able to execute multiple distributions such that the update processing section sets a plurality of section control devices as target section control devices at the same time and distributes the update data to each of the target section control devices; and when the multiple distributions are executed, the target section control devices each execute software update upon receipt of the update data, and the superior control device executes the alternative control on the target section control devices executing the software update.

3. The article transport facility according to claim 1, wherein:

the section control devices are each configured to be shiftable between a normal mode to perform control on the carrier and an update mode to perform no control on the carrier and perform a process for the software update;

when the software update is completed in the update mode, the target section control device transmits an update completion notice to the superior control device;

the superior control device starts the alternative control on condition that the target section control device has shifted to the update mode; and when the superior control device receives the update completion notice from the target section control device, the superior control device transmits, to the target section control device, a shift command to shift from the update mode to the normal mode and ends the alternative control on condition that the target section control device has shifted to the normal mode.

4. The article transport facility according to claim 1, wherein:

each of a plurality of existing files constituting the section control software includes existing version information; and the update processing section compares version information of each of a plurality of files constituting the update data with the existing version information of a corresponding one of the plurality of existing files constituting the section control software of the target section control device and generates data including files of the same type but in different versions and files not existing in the existing files among the plurality of files constituting the update data, as update data to be distributed to the target section control device.

5. The article transport facility according to claim 1, wherein:

the update processing section includes the superior control device and an update control terminal communicably connected to the superior control device;

the update control terminal performs determination of whether the update process procedure is executed or not, determination of the target section control device, and distribution of the update data to the target section control device; and the superior control device performs communication and commands to the target section control device.

6. The article transport facility according to claim 1, wherein:

the superior control device, by executing the alternative control, causes a plurality of carriers to travel within the specific section corresponding to the target section control device such that the plurality of carriers do not interfere with one another.

7. The article transport facility according to claim 1, wherein:

the superior control device is configured to perform, on each carrier of a plurality of carriers, a transport command with a specified transport source and a specified transport destination of an article; and each section control device is configured to control each carrier traveling in the specific section corresponding to each section control device based on the transport command.

* * * * *